United States Patent
Sugiyama

(10) Patent No.: US 11,824,110 B2
(45) Date of Patent: Nov. 21, 2023

(54) FIELD EFFECT TRANSISTOR AND METHOD FOR MANUFACTURING SAME

(71) Applicant: Nippon Telegraph and Telephone Corporation, Tokyo (JP)

(72) Inventor: Hiroki Sugiyama, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 414 days.

(21) Appl. No.: 17/297,060

(22) PCT Filed: Nov. 19, 2019

(86) PCT No.: PCT/JP2019/045211
§ 371 (c)(1),
(2) Date: May 26, 2021

(87) PCT Pub. No.: WO2020/116147
PCT Pub. Date: Jun. 11, 2020

(65) Prior Publication Data
US 2022/0029009 A1 Jan. 27, 2022

(30) Foreign Application Priority Data
Dec. 4, 2018 (JP) ................. 2018-227043

(51) Int. Cl.
*H01L 29/66* (2006.01)
*H01L 29/778* (2006.01)
*H01L 29/205* (2006.01)
*H01L 29/78* (2006.01)
*H01L 29/812* (2006.01)

(52) U.S. Cl.
CPC ........ *H01L 29/7786* (2013.01); *H01L 29/205* (2013.01); *H01L 29/66462* (2013.01); *H01L 29/7806* (2013.01); *H01L 29/812* (2013.01)

(58) Field of Classification Search
CPC .............. H01L 29/7786; H01L 29/205; H01L 29/66462; H01L 29/7806; H01L 29/812; H01L 29/0843; H01L 29/0847; H01L 29/66522; H01L 29/7783; H01L 29/78
See application file for complete search history.

(56) References Cited

U.S. PATENT DOCUMENTS

2009/0078966 A1 * 3/2009 Asai .................. H01L 29/66462
257/690

OTHER PUBLICATIONS

Li et al., "InP Lattice-matched HEMT with Regrown Source/Drain by MOCVD", IPRM 2011—23rd International onference on Indium Phosphide and Related Materials, 2011, 4 pages (Year: 2011).*
Li et al., "Material and Device Characteristics of Metamorphic In0.53Ga0.47As MOSHEMTs Grown on GaAs and Si ubstrates by MOCVD", IEEE Transactions on Electron Devices, vol. 60, No. 12, Dec. 2013, pp. 4112-4118. (Year: 2013).*

(Continued)

*Primary Examiner* — Niki H Nguyen
(74) *Attorney, Agent, or Firm* — Slater Matsil, LLP

(57) ABSTRACT

A buffer layer, an etching stop layer, and a channel layer are epitaxially grown in this order on a substrate. The substrate contains InP that has a high resistance by, for example, being doped with Fe. The buffer layer contains a compound semiconductor lattice-matched to InP. The etching stop layer includes $In_xAl_{1-x}P$ ($0 \leq x \leq 0.75$). The channel layer contains $In_yGa_{1-y}As$ ($0 < y \leq 1$).

14 Claims, 3 Drawing Sheets

(56) References Cited

OTHER PUBLICATIONS

J. A. Del Alamo, "Nanometre-scale electronics with III-V compound semiconductors", Nature, vol. 479, Nov. 2011, pp. 317-323. As discussed in the specification.
H. Hamada et al., "300-GHz, 100-GB/s InP-HEMT Wireless Transceiver Using a 300-GHz Fundamental Mixer", IEEE/MTT-S International Microwaves Symposium, 10. 1109/MWSYM. 2018. pp. 1480-1483. As discussed in the specification.
Q. Li et al., "InP Lattice-matched HEMT with Regrown Source/Drain by MOCVD", IPRM 2011—23rd International Conference on Indium Phosphide and Related Materials, 2011, 4 pages. As discussed in the specification.
Q. Li et al., "Material and Device Characteristics of Metamorphic In0.53Ga0.47As MOSHEMTs Grown on GaAs and Si Substrates by MOCVD", IEEE Transactions on Electron Devices, vol. 60, No. 12, Dec. 2013, pp. 4112-4118. As discussed in the specification.
X. Mei et al., "First Demonstration of Amplification at 1 THz Using 25-nm InP High Electron Mobility Transistor Process", IEEE Electron Device, Letters. vol. 36, No. 4, Apr. 2015, pp. 327-329. As discussed in the specification.
T. Suemitsu et al., "30-nm Two-Step Recess Gate InP-Based InAlAs/InGaAs HEMTs", IEEE Transactions on Electron Devices, vol. 49, No. 10, 2002, pp. 1694-1700. As discussed in the specification.
R. Terao et al. "InP/InGaAs Composite Metal-.Oxide-. Semiconductor field effect transistors with Regrown Source and Al2O3 Gate Dielectric Exhibiting Maximum Drain Current Exceeding 1.3 mA/µm", Applied Physics Express, vol. 4, 2011, 4 pages. As discussed in the specification.

\* cited by examiner

FIELD EFFECT TRANSISTOR AND METHOD FOR MANUFACTURING SAME

CROSS-REFERENCE TO RELATED APPLICATIONS

This application is a national phase entry of PCT Application No. PCT/JP2019/045211, filed on Nov. 19, 2019, which claims priority to Japanese Application No. 2018-227043, filed on Dec. 4, 2018, which applications are hereby incorporated herein by reference.

TECHNICAL FIELD

The present invention relates to a field effect transistor and a method for producing the same.

BACKGROUND

An InP-based heterojunction field effect transistor (InP-based heterostructure field effect transistor) using a III-V group compound semiconductor grown on semi-insulating InP substrate is also called an InP-based high electron mobility transistor (hereinafter, InP-based HEMT). Since these transistors use a channel made of InGaAs or InAs having high electron mobility, they have excellent high speed and low noise characteristics, and are expected to be applied to ultra-high frequency integrated circuits operating in the sub-terahertz and terahertz bands as described in Non Patent Literatures (NPLs) 1 and 2.

A metal-oxide-semiconductor field effect transistor (hereinafter referred to as MOSFET) having a channel of a III-V group compound semiconductor such as InGaAs or InAs is called a III-V-MOSFET, and is expected to be a next-generation element that can operate with low power consumption as described in NPL 3.

These transistors are fabricated by processing a thin film (semiconductor layer) produced by an epitaxial crystal growth method such as molecular beam epitaxy (MBE) and metal-organic vapor phase epitaxy (MOVPE) or metal-organic chemical vapor deposition (MOCVD) (hereinafter the last two are referred to as MOVPE).

For the InP-based HEMT and the InP-based III-V-MOSFET, it is important to reduce the access resistance between the source electrode and the channel and between the channel and the drain electrode in improving the transistor performance. For example, in the InP-based HEMT, as described in NPL 4, a source electrode and a drain electrode are formed on a contact layer made of n-type InGaAs or n-type InAlAs, whereby the access resistance with the channel is reduced.

In the above-described configuration, an undoped InAlAs or InP layer that acts as a spacer or a barrier layer under a gate electrode is sandwiched between the n-type contact layer and the channel layer, and the access resistance increases as much as it passes through these layers.

Therefore, as a method for reducing the access resistance, for example, as described in NPL 5, a technique has been reported in which the spacer layer and the barrier layer in the region under a source electrode and a drain electrode are removed, and InGaAs highly doped with Si on a buffer layer is regrown by the epitaxial growth method to reduce the access resistance.

Also in the production of an InP-based MOSFET formed on an InP substrate, as described in NPL 6, a technique has been reported in which a highly doped semiconductor layer is formed in the region under source and drain electrodes by the regrowth method described above.

The removal of the layer unnecessary for forming the highly-doped contact layer described above is mainly performed by wet etching. This is because it is difficult to flatten the surface after etching by the dry etching method at the atomic level. In order to form a high quality contact layer by regrowth, it is desirable that the surface exposed by etching has atomic level flatness. However, dry etching cannot ensured the flatness of the exposed surface, and is not preferable to form a high-quality contact layer by regrowth.

Further, in order to directly contact the heavily doped contact layer with the channel layer, it is necessary to perform etching process to reach at least the channel layer or the hetero interface between the channel layer and the buffer layer. In this etching process, since it is difficult to perform selective etching between InGaAs and InAs forming the channel layer and InAlAs forming the barrier layer, spacer layer, and buffer layer, it is difficult to stop the etching at the desired depth with good reproducibility.

CITATION LIST

Non Patent Literature

NPL 1: H. Hamada et al., "300-GHz, 100-Gb/s InP-HEMT Wireless Transceiver Using a 300-GHz Fundamental Mixer", IEEE/MTT-S International Microwaves Symposium, 10. 1109/MWSYM. 2018. 8439850, pp. 1480-1483, 2018.

NPL 2: X. Mei et al., "First Demonstration of Amplification at 1 THz Using 25-nm InP High Electron Mobility Transistor Process", IEEE Electron Device, Letters. vol. 36, no. 4, pp. 327-329, 2015.

NPL 3: J. A. del Alamo, "Nanometre-scale electronics with III-V compound semiconductors", Nature, vol. 479, pp. 317-323, 2011.

NPL 4: T. Suemitsu et al., "30-nm Two-Step Recess Gate InP-Based InAlAs/InGaAs HEMTs", IEEE Transactions on Electron Devices, vol. 49, no. 10, pp. 1694-1700, 2002.

NPL 5: Q. Li et al., "InP Lattice-matched HEMT with Regrown Source/Drain by MOCVD", IPRM 2011-23rd International Conference on Indium Phosphide and Related Materials, 2011.

NPL 6: R. Terao et al. "InP/InGaAs Composite Metal-.Oxide-.Semiconductor field effect transistors with Regrown Source and $Al_2O_3$ Gate Dielectric Exhibiting Maximum Drain Current Exceeding 1.3 mA/μm", Applied Physics Express, vol. 4, 054201, 2011.

NPL 7: Q. Li et al., "Material and Device Characteristics of Metamorphic $In_{0.53}Ga_{0.47}As$ MOSHEMTs Grown on GaAs and Si Substrates by MOCVD", IEEE Transactions on Electron Devices, vol. 60, no. 12, pp. 4112-4118, 2013.

SUMMARY

Technical Problem

In the above etching process, in order to control the etching depth with high precision and to form a flat surface after etching, there is a method in which an InP layer having a high etching selectivity with respect to InGaAs or InAlAs is inserted as an etching stop layer. For example, it is possible to insert an InP layer between the InGaAs channel layer and the InAlAs buffer layer. With this layer configuration, it is possible to automatically stop the etching at the InP layer and selectively remove the InGaAs channel layer by wet etching. In addition, in this method, the surface of the exposed InP layer can be made flat at the atomic level in order to treat the InP layer with wet etching.

However, the conduction band discontinuity between the InGaAs channel layer and the InP layer is smaller than the band discontinuity between the InGaAs channel layer and the InAlAs buffer layer. Therefore, when produced by the method described above, there is a problem in which the electron confinement in the InGaAs channel layer becomes insufficient, the InP layer also acts as a channel, and the electron mobility decreases. Further, since the electron confinement in the InGaAs channel layer is weakened, the short channel effect is more likely to occur in an element having a short gate length as compared with the structure in which the InGaAs channel is directly laminated on the InAlAs buffer layer.

As described above, in the related art, there has been a problem in which it is not easy to reduce the access resistance between the source/drain electrode and the channel layer while suppressing the decrease in electron mobility and the short channel effect in the channel layer.

Embodiments of the present invention have been made in order to solve the problems as described above, and is intended to reduce the access resistance between the source/drain electrode and the channel layer more easily in the state in which the decrease in electron mobility in the channel layer and the short channel effect are suppressed.

Means for Solving the Problem

The method for producing a field effect transistor according to embodiments of the present invention includes: a first step of epitaxially growing a buffer layer comprising a compound semiconductor lattice-matched to InP, an etching stop layer comprising $In_xAl_{1-x}P$ ($0 \leq x \leq 0.75$) and having a thickness not more than a critical film thickness, and a channel layer comprising $In_yGa_{1-y}As$ ($0 < y \leq 1$) on a substrate in this order; a second step of patterning the channel layer to form a mesa comprising the channel layer by an etching process in which etching is stopped at the etching stop layer; a third step of regrowing $In_zGa_{1-z}As$ ($0 < z \leq 1$) on the etching stop layer on both sides of the mesa to form a first contact layer and a second contact layer; a fourth step of forming a gate electrode on the channel layer of the mesa; and a fifth step of forming a source electrode on the first contact layer and a drain electrode on the second contact layer.

In one configuration example of the method for producing a field effect transistor, in the first step, the buffer layer, the etching stop layer, the channel layer, an electron supply layer comprising a compound semiconductor, a barrier layer comprising InAlAs, and a cap layer comprising InP are epitaxially grown in this order, in the second step, the cap layer, the barrier layer, the electron supply layer, and the channel layer are patterned to form the mesa, and in the fourth step, a gate electrode is formed on the cap layer of the mesa.

In one configuration example of the method for producing the field effect transistor, the substrate comprises semi-insulating InP.

In one configuration example of the method for producing the field effect transistor, the substrate comprises Si, and the buffer layer comprises GaAs or InP.

In one configuration example of the method for producing the field effect transistor, the substrate comprises GaAs, and the buffer layer comprises InP.

The field effect transistor according to embodiments of the present invention includes: a buffer layer which is formed on a substrate and comprises a compound semiconductor lattice-matched to InP; an etching stop layer which is formed on the buffer layer, comprises $In_xAl_{1-x}P$ ($0 \leq x \leq 0.75$), and has a thickness not more than a critical film thickness; a mesa which is formed on the etching stop layer and comprises a channel layer comprising $In_yGa_{1-y}As$ ($0 < y \leq 1$); a first contact layer and a second contact layer which are formed on the etching stop layer on both sides of the mesa and comprise $In_zGa_{1-z}As$ ($0 < z \leq 1$); a gate electrode formed on the channel layer of the mesa; a source electrode formed on the first contact layer; and a drain electrode formed on the second contact layer.

In one configuration example of the field effect transistor described above, the mesa comprises an electron supply layer consisting of a compound semiconductor formed on the channel layer, a barrier layer of InAlAs formed on the electron supply layer, and a cap layer formed from InP formed on the barrier layer, the gate electrode being formed on the cap layer.

Effects of Embodiments of the Invention

As described above, according to embodiments of the present invention, the etching stop layer comprises $In_xAl_{1-x}P$ ($0 \leq x \leq 0.75$) under the channel layer comprising $In_yGa_{1-y}As$ ($0 < y \leq 1$). This enables the access resistance between the source/drain electrode and the channel layer to be reduced more easily while electron mobility is reduced and a short channel effect in the channel layer is suppressed.

DETAILED DESCRIPTION OF ILLUSTRATIVE EMBODIMENTS

Hereinafter, a method for producing the field effect transistor according to an embodiment of the present invention will be described with reference to FIGS. 1A to 1G.

Figure 1A:
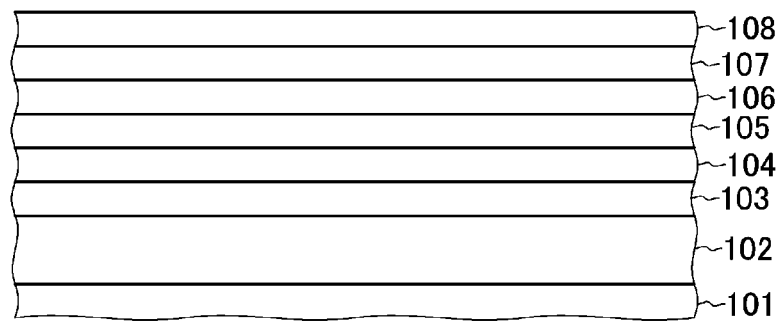
FIG. 1A is a cross-sectional view illustrating a configuration of a field effect transistor in an intermediate step for describing the method for producing a field effect transistor according to an embodiment of the present invention.

First, as illustrated in FIG. 1A, a buffer layer 102, an etching stop layer 103, and a channel layer 104 are epitaxially grown on a substrate 101 in this order (first step). When producing a high electron mobility transistor (HEMT), a spacer layer 105, an electron supply layer 106, a barrier layer 107, and a cap layer 108 are further formed on the channel layer 104. The buffer layer 102, the etching stop layer 103, the channel layer 104, the spacer layer 105, the electron supply layer 106, the barrier layer 107, and the cap layer 108 are formed in this order on the substrate 101 by epitaxial growth using an epitaxial crystal growth method such as the MBE method or MOVPE method.

The substrate 101 comprises, for example, InP having a high resistance by Fe doping. The buffer layer 102 comprises a compound semiconductor lattice-matched to InP. The buffer layer 102 is formed to have a thickness of about 200 nm.

The etching stop layer 103 comprises $In_xAl_{1-x}P$ ($0 \leq x \leq 0.75$). The $In_xAl_{1-x}P$ of this composition and the thickness of the etching stop layer 103 are set to be not more than the critical film thickness at which misfit dislocations due to lattice mismatch do not occur. For example, the etching stop layer 103 comprises $In_xAl_{1-x}P$ (x=0.7) and has a thickness of 5 nm. In this description, a state in which the lattice constants of the surface of the substrate 101 in the plane direction do not match is referred to as lattice mismatch.

The channel layer 104 comprises $In_yGa_{1-y}As$ ($0 < y \leq 1$). More preferably, in the channel layer 104, the value of In composition y of $In_yGa_{1-y}As$ is larger than 0.53 which is lattice-matched to InP. The thickness of the channel layer 104 is set to be not more than the critical film thickness of InGaAs that does not cause misfit dislocation due to lattice mismatch. For example, the channel layer 104 has a thickness of about 10 nm.

The spacer layer 105 comprises InAlAs. The spacer layer 105 is formed to have a thickness of, for example, about 3 nm.

The electron supply layer 106 comprises a compound semiconductor such as InAlAs. The electron supply layer 106 is doped with Si. For example, the electron supply layer 106 is planar-doped with Si, and the sheet concentration of Si is, for example, about $5 \times 10^{12}$ cm$^{-2}$. The concentration of Si in the electron supply layer 106 is appropriately adjusted to obtain a desired threshold voltage in HEMT.

The barrier layer 107 comprises, for example, InAlAs. The barrier layer 107 is formed to have a thickness of about 6 nm. The cap layer 108 comprises InP. The cap layer 108 is formed to have a thickness of about 5 nm.

As described above, a value of the band discontinuity between the etching stop layer 103 comprising $In_xAl_{1-x}P$ ($0 \leq x \leq 0.75$) and the channel layer 104 comprising $In_yGa_{1-y}As$ ($0 < y \leq 1$) is larger than when the etching stop layer comprises InAlAs.

Figure 1B:
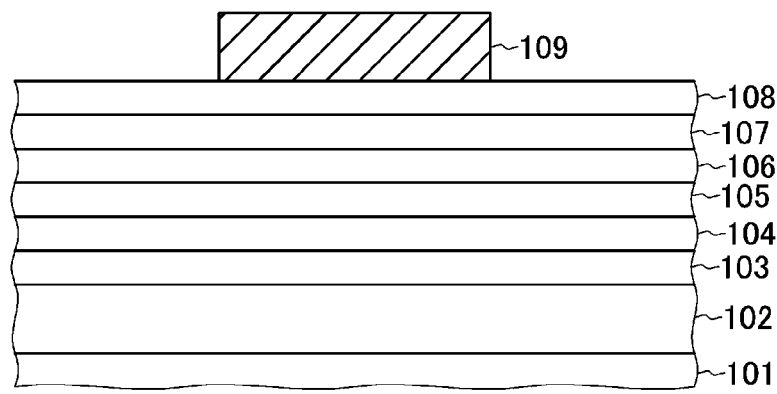
FIG. 1B is a cross-sectional view illustrating a configuration of a field effect transistor in an intermediate step of describing the method for producing the field effect transistor according to the embodiment of the present invention.

Next, as illustrated in FIG. 1B, for example, an inorganic mask pattern 109 is formed in the region where the gate electrode is to be formed. The inorganic mask pattern 109 may comprise, for example, silicon oxide ($SiO_2$). The shape of the inorganic mask pattern 109 in a plan view is, for example, a stripe shape extending from the front side to the back side of FIG. 1B (gate width direction).

For example, a mask layer having an opening at a position where the inorganic mask pattern 109 is formed on the cap layer 108 by a known lithography technique. Next, silicon oxide is deposited on the mask layer by a well-known chemical vapor deposition method or the like. By this process, silicon oxide is also deposited inside the opening of the mask layer. Thereafter, silicon oxide on the mask layer is removed and silicon oxide deposited on the portion of the openings in the mask layer can be left by removing (lifting-off) the mask layer, and, thereby an inorganic mask pattern 109 is formed from the remaining silicon oxide.

Figure 1C:
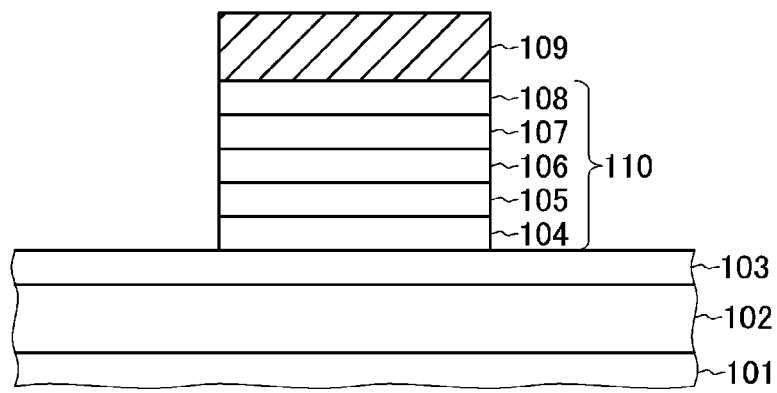
FIG. 1C is a cross-sectional view illustrating a configuration of a field effect transistor in an intermediate step of describing the method for producing the field effect transistor according to the embodiment of the present invention.

Next, the channel layer 104 is patterned using the inorganic mask pattern 109 as a mask by an etching process in which the etching is stopped at the etching stop layer 103, and a mesa 110 made of the channel layer 104 is formed as illustrated in FIG. 1C (second step). More specifically, the channel layer 104 in the region where the inorganic mask pattern 109 is not formed is etched away by a wet etching process in which the channel layer 104 is etched but the etching stop layer 103 is not etched, and, thereby the mesa 110 is formed. The shape of the mesa 110 in a plan view is, for example, formed in a stripe shape extending from the front side to the back side of FIG. 1C (gate width direction).

In the embodiment, the spacer layer 105, the electron supply layer 106, the barrier layer 107, and the cap layer 108 are formed on the channel layer 104. Thus, in an etching process using the inorganic mask pattern 109 as a mask, the channel layer 104, the spacer layer 105, the electron supply layer 106, the barrier layer 107, the cap layer 108 are patterned to form a mesa 110 consisting of the channel layer 104, the spacer layer 105, the electron supply layer 106, the barrier layer 107, and the cap layer 108.

For example, by wet etching using an etchant comprising HCl, $H_3PO_4$ or the like, the cap layer 108 comprising InP, the barrier layer 107 comprising InAlAs, the electron supply layer 106, and the spacer layer 105 can be etched. In this wet etching, the channel layer 104 comprising InGaAs is hardly etched.

Next, for example, by wet etching using an etchant made of citric acid, the channel layer 104 comprising InGaAs can be etched. In this wet etch, the etching stop layer 103 comprising $In_xAl_{1-x}P$ is not etched, and the surface of the etching stop layer 103 that is flat at the atomic level can be exposed on both sides of the mesa 110.

Figure 1D:
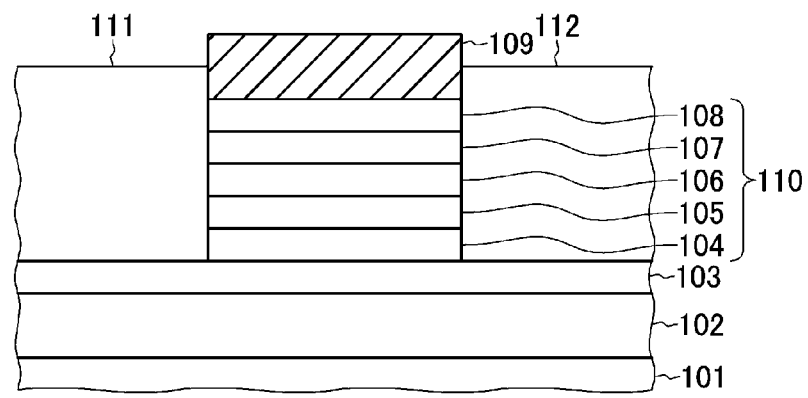
FIG. 1D is a cross-sectional view illustrating a configuration of a field effect transistor in an intermediate step of describing the method for producing the field effect transistor according to the embodiment of the present invention.

Next, $In_zGa_{1-z}As$ ($0 < z \leq 1$) in which a relatively high concentration of an n-type impurity has been doped are regrown on the etching stop layer 103 on both sides of the mesa 110, and a first contact layer 11 and a second contact layer 112 are formed (third step) as illustrated in FIG. 1D. For example, $In_zGa_{1-z}As$ ($0 < z \leq 1$) doped with the n-type impurity can be regrown by an epitaxial growth method such as the MBE method or MOVPE method. In this regrowth, the inorganic mask pattern 109 is used as a selective growth mask, and the growth conditions are such that $In_zGa_{1-z}As$ ($0 < z \leq 1$) is formed on the silicon oxide is not deposited. The doping concentration of the n-type impurity is, for example, $5 \times 10^{19}$ cm$^{-3}$ or more (see NPLs 6 and 7).

Figure 1E:
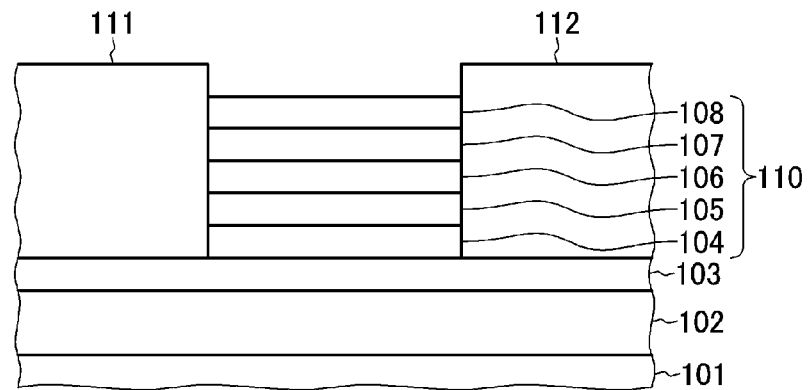
FIG. 1E is a cross-sectional view illustrating a configuration of a field effect transistor in an intermediate step of describing the method for producing the field effect transistor according to the embodiment of the present invention.

Next, the inorganic mask pattern 109 is removed, and the uppermost layer (cap layer 108) of the mesa 110 is exposed as illustrated in FIG. 1E. The inorganic mask pattern 109 comprising silicon oxide can be selectively removed by wet etching using an HF-based etchant.

Figure 1F:
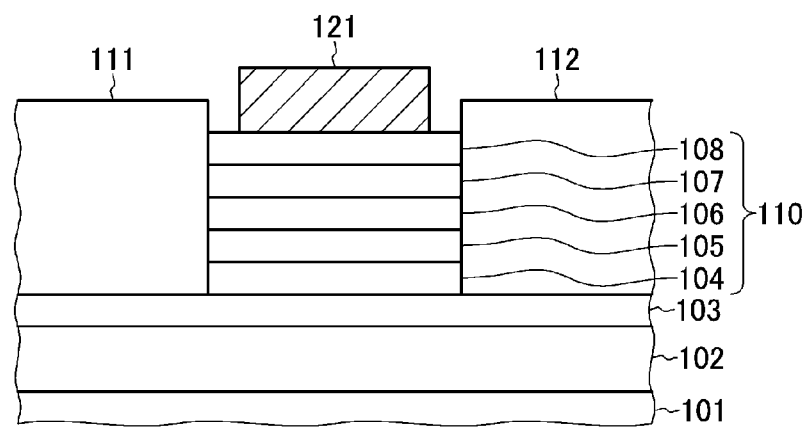
FIG. 1F is a cross-sectional view illustrating a configuration of a field effect transistor in an intermediate step of describing the method for producing the field effect transistor according to the embodiment of the present invention.

Next, as illustrated in FIG. 1F, the gate electrode 121 is formed on the channel layer 104 of the mesa 110 (fourth step). In the embodiment, the spacer layer 105, the electron supply layer 106, the barrier layer 107, and the cap layer 108 are formed on the channel layer 104, and the gate electrode 121 that makes a Schottky barrier junction is formed on the cap layer 108. For example, using the well-known lift-off method, the gate electrode 121 can be formed from a predetermined gate electrode material.

Figure 1G:
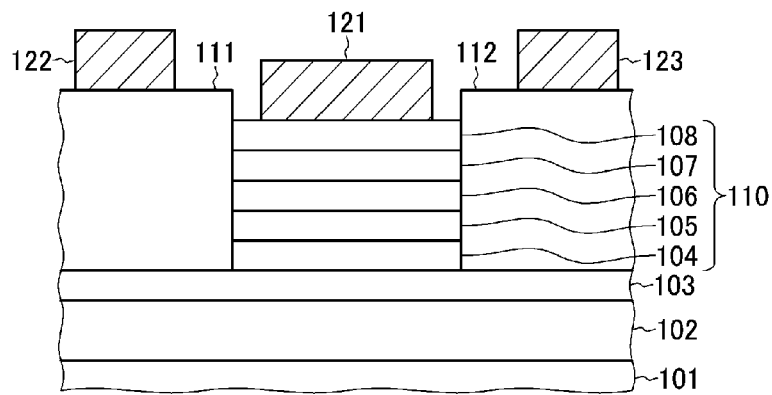
FIG. 1G is a cross-sectional view illustrating a configuration of a field effect transistor in an intermediate step of describing the method for producing the field effect transistor according to the embodiment of the present invention.

Next, as illustrated in FIG. 1G, the source electrode 122 is formed on the first contact layer 111, and the drain electrode 123 is formed on the second contact layer 112 (fifth step). The source electrode 122 is formed so as to be in ohmic contact with the first contact layer 11. Similarly, the drain electrode 123 is formed in a state of being in ohmic contact with the second contact layer 112. For example, using the well-known lift-off method, the source electrode 122 and the drain electrode 123 can be formed from a predetermined electrode material.

A method for producing a field effect transistor in the embodiment described above provides a field effect transistor includes: a buffer layer 102 formed on a substrate 101; an etching stop layer 103 formed on the buffer layer 102; and a mesa 110 comprising a channel layer 104 formed on the etching stop layer 103; A first contact layer in and a second contact layer 112 formed on the etching stop layer 103 on both sides of the mesa 110, and a gate electrode 121 formed on the channel layer 104 of the mesa 110; a source electrode 122 formed on the first contact layer in and a drain electrode 123 formed on the second contact layer 112.

In an embodiment, the mesa 110 comprises a spacer layer 105 formed on the channel layer 104, an electron supply layer 106 formed on the spacer layer 105, a barrier layer 107 formed on the electron supply layer 106, and a cap layer 108 formed on the barrier layer 107, the gate electrode 121 being formed on the cap layer 108.

According to the producing method of the embodiment described above, the first contact layer in and the second contact layer 112 with high quality can be formed by epitaxial growth from the surface of the flat etching stop layer 103 at the atomic level. As a result, a field effect transistor having a low access resistance between the source/drain electrodes and the channel layer can be produced.

Furthermore, since the etching stop layer 103 disposed in the lower layer of the channel layer 104 comprising $In_yGa_{1-y}As$ comprises $In_xAl_{1-x}P$ ($0 \le x \le 0.75$), the conduction band discontinuity between the channel layer 104 and the etching stop layer 103 are greater than in the case of InGaAs/InAlAs. As a result, the confinement of electrons inside the channel layer 104 is promoted, and the short channel effect in the field effect transistor can be suppressed.

Figure 2:
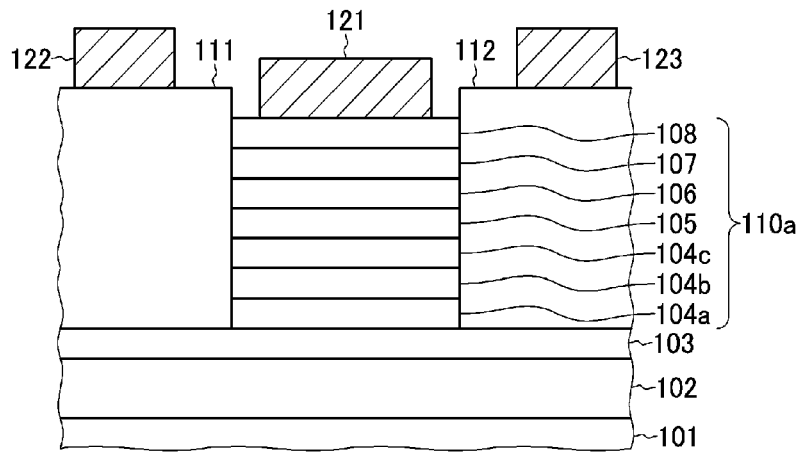
FIG. 2 is a cross-sectional view illustrating a configuration of an field effect transistor according to another embodiment of the present invention.

In the above description, the channel layer 104 comprises one layer, but it may have a three-layer structure comprising the first channel layer 104a, the second channel layer 104b, and the third channel layer 104c as illustrated in FIG. 2. In this case, the mesa 110a includes the first channel layer 104a, the second channel layer 104b, the third channel layer 104c, the spacer layer 105, the electron supply layer 106, the barrier layer 107, and the cap layer 108.

The first channel layer 104a and the third channel layer 104c comprise InGaAs having an In composition x satisfying $0.53 \le x \le 0.8$, and the second channel layer 104b comprises InGaAs satisfying $0.8 < x \le 1$. With this configuration, the band gap of the conduction band edge of the second channel layer 104b is lower than that of the first channel layer 104a and the third channel layer 104c. The second channel layer 104b has a thickness not more than a so-called critical film thickness at which misfit dislocations due to lattice mismatch between upper and lower layers do not occur.

Figure 3:
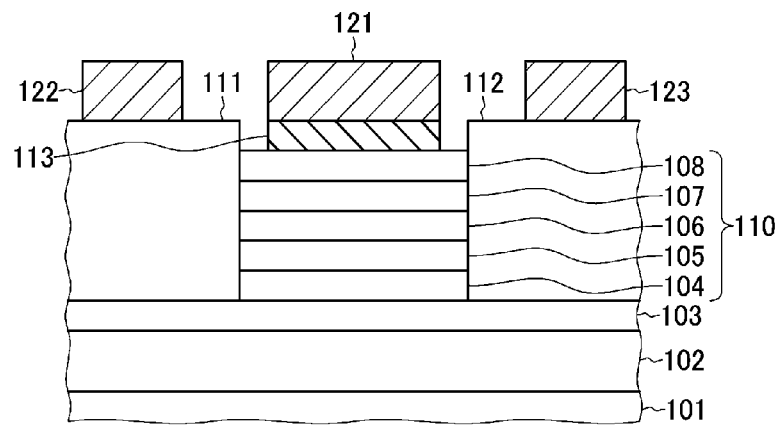
FIG. 3 is a cross-sectional view illustrating a configuration of an field effect transistor according to another embodiment of the present invention.

The gate electrode 121 may be formed on the cap layer 108 via the gate insulating layer 113 as illustrated in FIG. 3.

The gate insulating layer 113 may comprise, for example, an oxide such as $Al_2O_3$ or $HfO_2$.

Although the HEMT has been described as an example in the above, the same applies to the case of the MOSFET. The substrate is not limited to InP, and may comprise Si, GaAs, or the like (see NPL 7). In addition, a crystal layer having the same lattice constant as InP grown via the intentionally lattice mitigated buffer layer can be formed on a substrate comprising Si or GaAs, and a buffer layer, an etching stop layer, and a channel layer may be epitaxially grown on the crystal layer.

The first contact layer and the second contact layer are not limited to those comprising InGaAs having a uniform composition in the layer thickness direction. For example, the etching stop layer side may include InGaAs lattice-matched to InP, and the source electrode and drain electrode sides may include InGaAs or InAs having a high In composition. In this case, the film thickness of the region comprising InGaAs or InAs having a high In composition is set to be not more than a critical film thickness at which misfit dislocations do not occur.

In the above, the first contact layer and the second contact layer are regrown using the inorganic mask pattern, the inorganic mask pattern is removed, and then the gate electrode is formed, but the invention is not limited to this. For example, after forming the gate electrode or the gate insulating layer and the gate electrode on the cap layer, the etching stop layer is exposed by etching using the gate electrode as a mask, and the first contact layer and the second contact layer may be regrown from the exposed etching stop layer.

In addition, each layer on the substrate side of the gate electrode is formed according to the application. For example, when producing a MOSFET, a cap layer may be formed on a channel layer, and a gate electrode may be formed on the cap layer via a gate insulating layer.

As described above, according to embodiments of the present invention, the etching stop layer under the channel layer comprising $In_yGa_{1-y}As$ ($0 < y \le 1$) comprises $In_xAl_{1-x}P$ ($0 \le x \le 0.75$). This enables to reduce more easily the access resistance between the source/drain electrodes and the channel layer while electron mobility is reduced and a short channel effect in the channel layer is suppressed.

The present invention is not limited to the embodiments described above, and it is obvious that many modifications and combinations can be implemented by a person having ordinary knowledge in the field within the technical spirit of the present invention.

REFERENCE SIGNS LIST

101 Substrate
102 Buffer layer
103 Etching stop layer
104 Channel layer
105 Spacer layer
106 Electron supply layer
107 Barrier layer
108 Cap layer
109 Inorganic mask pattern
110 Mesa
111 First contact layer
112 Second contact layer
121 Gate electrode
122 Source electrode
123 Drain electrode.

The invention claimed is:

1. A method for producing a field effect transistor comprising:
    a first step of epitaxially growing at least a buffer layer comprising a compound semiconductor lattice-matched to InP, an etching stop layer comprising $In_xAl_{1-x}P$ ($0 \leq x \leq 0.75$) and having a thickness not more than a critical film thickness, and a channel layer comprising $In_yGa_{1-y}As$ ($0 < y \leq 1$) on a substrate in this order;
    a second step of patterning the channel layer to form a mesa comprising the channel layer by an etching process in which etching is stopped at the etching stop layer;
    a third step of regrowing $In_zGa_{1-z}As$ ($0 < z \leq 1$) on the etching stop layer on both sides of the mesa to form a first contact layer and a second contact layer;
    a fourth step of forming a gate electrode on an uppermost layer of the mesa; and
    a fifth step of forming a source electrode on the first contact layer and a drain electrode on the second contact layer.

2. The method for producing a field effect transistor according to claim 1, wherein:
    in the first step, the buffer layer, the etching stop layer, the channel layer, an electron supply layer comprising a compound semiconductor, a barrier layer comprising InAlAs, and a cap layer comprising InP are epitaxially grown in this order,
    in the second step, the cap layer, the barrier layer, the electron supply layer, and the channel layer are patterned to form the mesa, and
    in the fourth step, a gate electrode is formed on the cap layer of the mesa.

3. The method for producing a field effect transistor according to claim 1, wherein the substrate comprises semi-insulating InP.

4. The method for producing a field effect transistor according to claim 1, wherein the substrate comprises Si, and the buffer layer comprises GaAs or InP.

5. The method for producing a field effect transistor according to claim 1, wherein the substrate comprises GaAs, and the buffer layer comprises InP.

6. A field effect transistor comprising:
    a buffer layer on a substrate and comprising a compound semiconductor lattice-matched to InP;
    an etching stop layer on the buffer layer and comprising $InxAl1-xP$ ($0 \leq x \leq 0.75$);
    a mesa structure on the etching stop layer and comprising at least a channel layer, the channel layer comprising $InyGa1-yAs$ ($0 < y \leq 1$);
    a first contact layer and a second contact layer which on the etching stop layer on opposing sides of the mesa and comprising $InzGa1-zAs$ ($0 < z \leq 1$);
    a gate electrode on an uppermost layer of the mesa;
    a source electrode on the first contact layer; and
    a drain electrode formed on the second contact layer.

7. The field effect transistor according to claim 6, wherein the mesa further comprises:
    an electron supply layer comprising a compound semiconductor on the channel layer;
    a barrier layer which is on the electron supply layer and comprising InAlAs; and
    a cap layer which is on the barrier layer and comprising InP; and
    the gate electrode is contacts the cap layer.

8. The field effect transistor according to claim 6, wherein the gate electrode is contacts the channel layer.

9. A method for producing a field effect transistor comprising:
    epitaxially growing a buffer layer on a substrate and comprising a compound semiconductor lattice-matched to InP;
    epitaxially growing an etching stop layer on the buffer layer and comprising $In_xAl_{1-x}P$ ($0 \leq x \leq 0.75$);
    epitaxially growing a channel layer on the etching stop layer and comprising $In_yGa_{1-y}As$ ($0 < y \leq 1$);
    patterning a mesa by an etching process, wherein patterning the mesa comprises patterning the channel layer, and wherein the etching process terminates at the etching stop layer; and
    regrowing $In_zGa_{1-z}As$ ($0 < z \leq 1$) on the etching stop layer on opposing sides of the mesa to form a first contact layer and a second contact layer.

10. The method for producing a field effect transistor according to claim 9 further comprising:
    forming a gate electrode on an uppermost layer of the mesa; and
    forming a source electrode on the first contact layer and a drain electrode on the second contact layer.

11. The method for producing a field effect transistor according to claim 10, further comprising:
    forming an electron supply layer on the channel layer and comprising a compound semiconductor;
    forming a barrier layer on the electron supply layer and comprising InAlAs; and
    forming a cap layer on the barrier layer and comprising InP, wherein patterning the mesa further comprises patterning the cap layer, the barrier layer, and the electron supply layer, and wherein the uppermost layer of the mesa is the cap layer.

12. The method for producing a field effect transistor according to claim 11, wherein the substrate comprises Si, and the buffer layer comprises GaAs or InP.

13. The method for producing a field effect transistor according to claim 11, wherein the substrate comprises GaAs, and the buffer layer comprises InP.

14. The method for producing a field effect transistor according to claim 9, wherein the substrate comprises semi-insulating InP.

* * * * *